United States Patent
Seong

(10) Patent No.: US 7,810,003 B2
(45) Date of Patent: Oct. 5, 2010

(54) METHOD OF GENERATING TEST CLOCK SIGNAL AND TEST CLOCK SIGNAL GENERATOR FOR TESTING SEMICONDUCTOR DEVICES

(75) Inventor: Han-Soo Seong, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 398 days.

(21) Appl. No.: 11/862,305

(22) Filed: Sep. 27, 2007

(65) Prior Publication Data

US 2008/0103719 A1  May 1, 2008

(30) Foreign Application Priority Data

Oct. 26, 2006  (KR) ..................... 10-2006-0104445

(51) Int. Cl.
 *G01R 31/3177* (2006.01)
 *G01R 31/30* (2006.01)
(52) U.S. Cl. ..................... 714/731; 714/724
(58) Field of Classification Search ............ None
 See application file for complete search history.

(56) References Cited

U.S. PATENT DOCUMENTS

| 6,711,042 | B2 * | 3/2004 | Ishikawa ..................... 365/51 |
| 2003/0009714 | A1 | 1/2003 | Evans |
| 2006/0066368 | A1 * | 3/2006 | Gabato et al. ............... 327/158 |
| 2007/0174648 | A1 * | 7/2007 | Panchal ..................... 713/500 |

FOREIGN PATENT DOCUMENTS

| JP | 11-329000 | 11/1999 |
| JP | 2001-159928 | 6/2001 |
| JP | 2005-140759 | 6/2005 |
| KR | 1020010074020 A | 8/2001 |
| KR | 1020030005492 A | 1/2003 |

* cited by examiner

*Primary Examiner*—Kevin L Ellis
*Assistant Examiner*—Dipakkumar Gandhi
(74) *Attorney, Agent, or Firm*—Volentine & Whitt, P.L.L.C.

(57) ABSTRACT

A system and method of generating a test clock signal for scan testing of a main circuit in a semiconductor device includes receiving an external clock signal and a control signal and generating a gated clock signal by gating an internal clock signal based on the control signal. The internal clock signal has a frequency higher than a frequency of the external clock signal. One of the external clock signal and the gated clock signal is selectively output based on the control signal.

24 Claims, 13 Drawing Sheets

US 7,810,003 B2

METHOD OF GENERATING TEST CLOCK SIGNAL AND TEST CLOCK SIGNAL GENERATOR FOR TESTING SEMICONDUCTOR DEVICES

CROSS-REFERENCE TO RELATED APPLICATIONS

A claim of priority is made to Korean Patent Application No. 10-2006-0104445, filed on Oct. 26, 2006, the subject matter of which is hereby incorporated by reference.

BACKGROUND OF THE INVENTION

1. Field of the Invention

The present invention relates to a method of generating a test clock signal and a test clock signal generator. More particularly, the present invention relates to a method of generating a test clock signal and a test clock signal generator for testing semiconductor devices.

2. Description of the Related Art

A wafer passed through a fabrication process includes multiple chips having substantially the same structure, referred to as "die." Generally, some chips on the wafer may have defects. Thus, a sorting process, which determines whether chips are defective and isolates the defective chips, is important. Sorting processes may be performed on the chips on a wafer or may be performed on packaged semiconductor devices.

A pad is an input/output part in a semiconductor device. The semiconductor device may receive an electric signal from an external source or send an electric signal to an external receiver through the pad.

During a testing process, variables such as signal delay, current capacity, etc., are checked, referred to as a "parameter test." In addition, semiconductor devices are checked to determine whether the semiconductor devices properly perform a designed operation, referred to as a "function test." Generally, semiconductor devices including a logic circuit also undergo a scan test, and semiconductor devices including a memory device also undergo a built-in self test (BIST).

FIG. 1 is a block diagram illustrating a conventional test system for semiconductor devices. Referring to FIG. 1, a test system 100 includes a tester 110 and a semiconductor device 120.

The tester 110 rapidly provides the semiconductor device 120 with variable test signals for operating the semiconductor device 120 under actual conditions. When the semiconductor device 120 receives the test signals, it operates according to the test signals and the tester 110 determines whether the semiconductor device 120 performs a predetermined operation. When the semiconductor device 120 does not perform the predetermined operation, the tester 110 treats the semiconductor device 120 as a defective semiconductor device.

Recently, operating frequencies of internal logic circuits in semiconductor devices have gradually increased. The operating frequency of an internal logic circuit in some semiconductor devices is over 400 MHz. In contrast, the maximum clock frequency presently used is generally no more than about 200 MHz. A tester that has a high clock frequency and is accurate is very expensive. Use of an expensive tester increases the cost of manufacturing the semiconductor devices.

In addition, the pads which provide the input/output passages of the semiconductor devices may not transmit high frequency signals. As a result, although a tester capable of providing high frequency test signals may exist, the internal logic circuit in the semiconductor devices may not actually receive the high frequency test signals. Thus, the semiconductor devices must have pads with a good frequency response. However, pads having a good frequency response further increase production costs of the semiconductor devices.

FIG. 2 is a timing diagram illustrating a conventional scan test. Generally, the scan test has two shift periods 210 and 230 and a capture period 220.

During the shift periods 210 and 230, test vectors are input, and during the capture period 220, a logic circuit between flip-flops in a semiconductor device is tested, based on the test vectors. A test for the internal logic circuit in the semiconductor device by a real operating frequency is referred to as an "at-speed test," which is performed in the capture period 220. As illustrated in FIG. 2, the capture period 220 includes a gated clock signal that is generated by gating a clock signal generated by a phase-locked loop (PLL) in the semiconductor device. The flip-flops in the semiconductor device operate synchronized with the gated clock signal.

In relation to the at-speed test, U.S. Patent Application Publication Number 2003/0009714 to EVANS discloses a test system for testing a semiconductor device having a high speed operating frequency by using a tester having a low speed clock frequency. EVANS discloses a scan test process having shift periods and a capture period, and discloses that a number of pulses included in a gated clock signal in the capture period may be selected.

For testing according to the conventional test systems, a clock signal generator that efficiently generates a clock signal used in the shift periods and the capture period is required.

SUMMARY OF THE INVENTION

An aspect of the present invention provides a method of generating a test clock signal for testing a semiconductor device. The method includes receiving an external clock signal and a control signal, generating a gated clock signal by gating an internal clock signal based on the control signal, and selectively outputting one of the external clock signal and the gated clock signal. The internal clock signal has a frequency higher than a frequency the external clock signal.

Generating the gated clock signal may include generating a gate control signal, based on the control signal, synchronized with the internal clock signal, and gating the internal clock signal according to the gate control signal. Generating the gate control signal may include generating a first control signal by synchronizing the control signal with the internal clock signal and generating a second control signal, which is initially active and which becomes inactive after a number of pulses of the internal clock signal equals a predetermined number after the first control signal becomes active. The gate control signal is active when both the first control signal and the second control signal are active.

Gating the internal clock signal may include outputting the internal clock signal when the gate control signal is active, and blocking the internal clock signal when the gate control signal is inactive. The internal clock signal may include an output clock signal of a phase lock loop in the semiconductor device.

Selectively outputting the external clock signal or the gated clock signal may include outputting the gated clock signal when the control signal is active and outputting the external clock signal when the control signal is inactive.

Another aspect of the present invention provides a method of generating a test clock signal for scan testing of a main circuit in a semiconductor device. The method includes receiving an external clock signal and a control signal generated externally from the semiconductor device; generating a reference clock signal synchronized with an internal clock signal based on the external clock signal; and generating multiple delayed clock signals by delaying the reference clock signal using flip-flops operating synchronously with the internal clock signal. A gated clock signal is generated based on the reference clock signal and the delayed clock signals. One of the external clock signal and the gated clock signal is selectively output according to the control signal.

Generating the delayed clock signals may include generating a first delayed clock signal corresponding to the reference clock signal delayed by a half period of the internal clock signal, generating a second delayed clock signal corresponding to the reference clock signal delayed by one period of the internal clock signal, and generating a third delayed clock signal corresponding to the reference clock signal delayed by one and a half periods of the internal clock signal.

Generating the gated clock signal may include performing an XOR operation of the reference clock signal and the delayed clock signals. Generating the gated clock signal may further include performing an AND operation of a result of the XOR operation and the external clock signal. Alternatively, generating the gated clock signal may further include inverting the external clock signal and performing an AND operation of a result of the XOR operation and the inverted external clock signal. Also, generating the gated clock signal may include selecting at least four clock signals from among the reference clock signal and the multiple delayed clock signals, and performing an XOR operation of the selected clock signals.

Generating the reference clock signal may include inverting the external clock signal and synchronizing the inverted external clock signal with the internal clock signal. Also, selectively outputting one of the external clock signal and the gated clock signal may include outputting the gated clock signal when the control signal is active and outputting the external clock signal when the control signal is inactive.

Another aspect of the present invention provides a test clock signal generator for testing a semiconductor device. The test clock signal generator includes a gated clock signal generator and a clock signal multiplexer. The gated clock signal generator is configured to generate a gated clock signal by gating an internal clock signal based on an external control signal provided to the semiconductor device. The internal clock signal has a frequency higher than a frequency of an external clock signal. The clock signal multiplexer is configured to selectively output one of the external clock signal and the gated clock signal.

The gated clock signal generator may include a gate control signal generator configured to generate a gate control signal, based on the external control signal, synchronized with the internal clock signal, and a clock gating circuit configured to gate the internal clock signal according to the gate control signal. The gate control signal generator may include a flip-flop configured to generate a first control signal by synchronizing the external control signal with the internal clock signal; a counting circuit configured to generate a second control signal, which is inactivated based on counting pulses of the internal clock signal when the first control signal is active; and a logic circuit configured to generate the gate control signal, which is activated when both the first control signal and the second control signal are active. The clock gating circuit may output the internal clock signal when the gate control signal is active, and may block the internal clock signal when the gate control signal is inactive.

The internal clock signal may be generated by a phase lock loop in the semiconductor device. Also, the clock signal multiplexer may output the gated clock signal when the control signal is active and the external clock signal when the control signal is inactive.

Yet another aspect of the present invention provides a test clock signal generator for scan testing of a main circuit in a semiconductor device. The test clock signal generator includes a reference clock signal generating circuit, a delayed clock signal generating circuit, a gated clock signal generating circuit, and a clock signal multiplexer. The reference clock signal generating circuit is configured to generate a reference clock signal synchronized with an internal clock signal based on an external clock signal and a control signal provided to the semiconductor device, the internal clock signal having a higher frequency than the external clock signal. The delayed clock signal generating circuit is configured to generate multiple delayed clock signals synchronized with the internal clock signal by delaying the reference clock signal. The delayed clock signal generating circuit includes multiple flip-flops. The gated clock signal generating circuit is configured to generate a gated clock signal, based on the reference clock signal and the delayed clock signals. The clock signal multiplexer is configured to selectively output one of the external clock signal and the gated clock signal according to the control signal.

The multiple flip-flops may include a first flip-flop configured to generate a first delayed clock signal corresponding to the reference clock signal delayed by a half period of an internal clock signal; a second flip-flop configured to generate a second delayed clock signal corresponding to the reference clock signal delayed by one period of the internal clock signal; and a third flip-flop configured to generate a third delayed clock signal corresponding to the reference clock signal delayed by one and a half periods of the internal clock signal.

The gated clock signal generating circuit may include an XOR circuit for performing an XOR operation on the reference clock signal and the delayed clock signals. The gated clock signal generating circuit may further include an AND circuit for performing an AND operation on a result of the XOR operation and the external clock signal. Also, the gated clock signal generating circuit may include an inverter configured to invert the external clock signal, and an AND circuit configured to perform an AND operation on the result of the XOR operation and the inverted external clock signal. The gated clock signal generating circuit may include a selecting circuit configured to select at least four clock signals from among the reference clock signal and the delayed clock signals, and an XOR circuit configured to perform an XOR operation on the selected clock signals.

The reference clock signal generating circuit may include an inverter configured to invert the external clock signal and a flip-flop configured to output the inverted external clock signal, synchronized with the internal clock signal. The clock signal multiplexer may output the gated clock signal while the control signal is activated and the external clock signal while the control signal is inactivated.

BRIEF DESCRIPTION OF THE DRAWINGS

The embodiments of the present invention will be described with reference to the attached drawings, in which.

DESCRIPTION OF THE EMBODIMENTS

Figure 1:
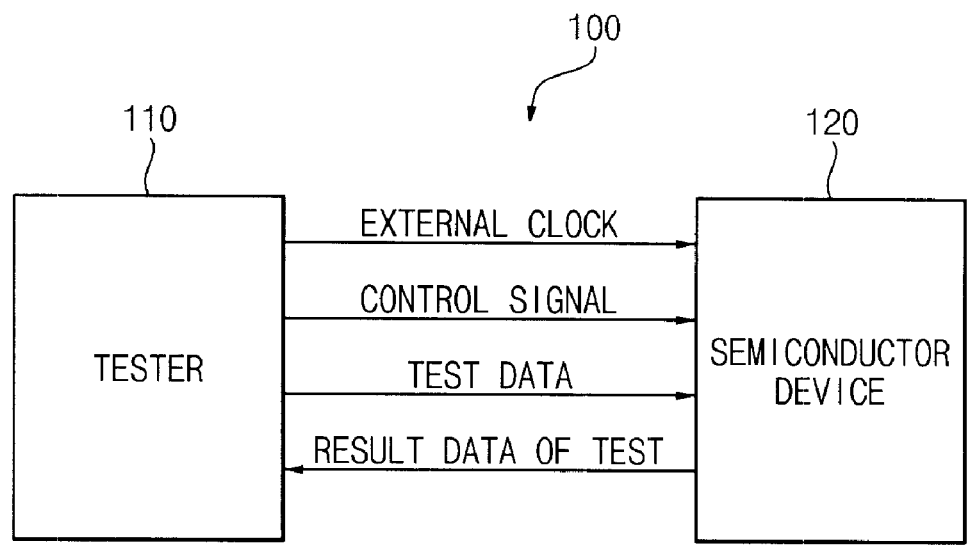
FIG. 1 is a block diagram illustrating a conventional test system of semiconductor devices.
Figure 2:
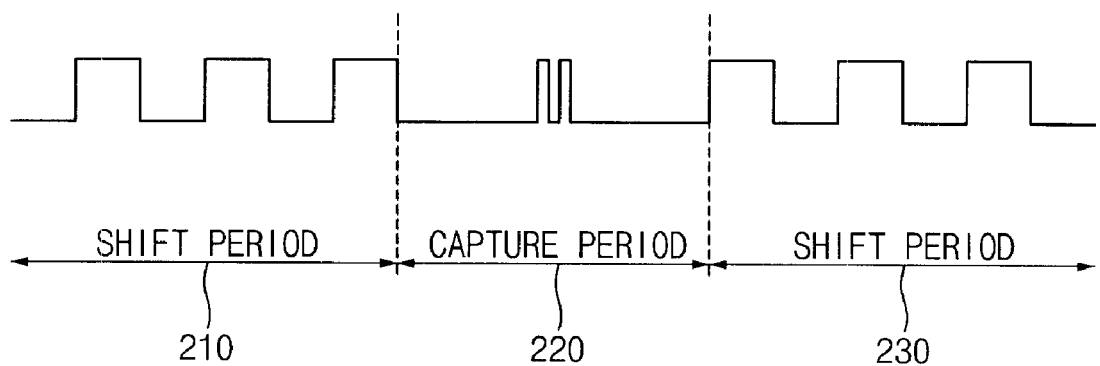
FIG. 2 is a timing diagram illustrating a conventional scan test.

The present invention will now be described more fully with reference to the accompanying drawings, in which illustrative embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that, although the terms first, second, etc., may be used herein to describe various elements, these elements should not be limited by these terms. These terms are used merely to distinguish one element from another. For example, a first element could be termed a second element, and similarly, a second element could be termed a first element, without departing from the scope of the present invention. Also, as used herein, the term "and/or" includes any and all combinations of one or more of the associated listed items.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
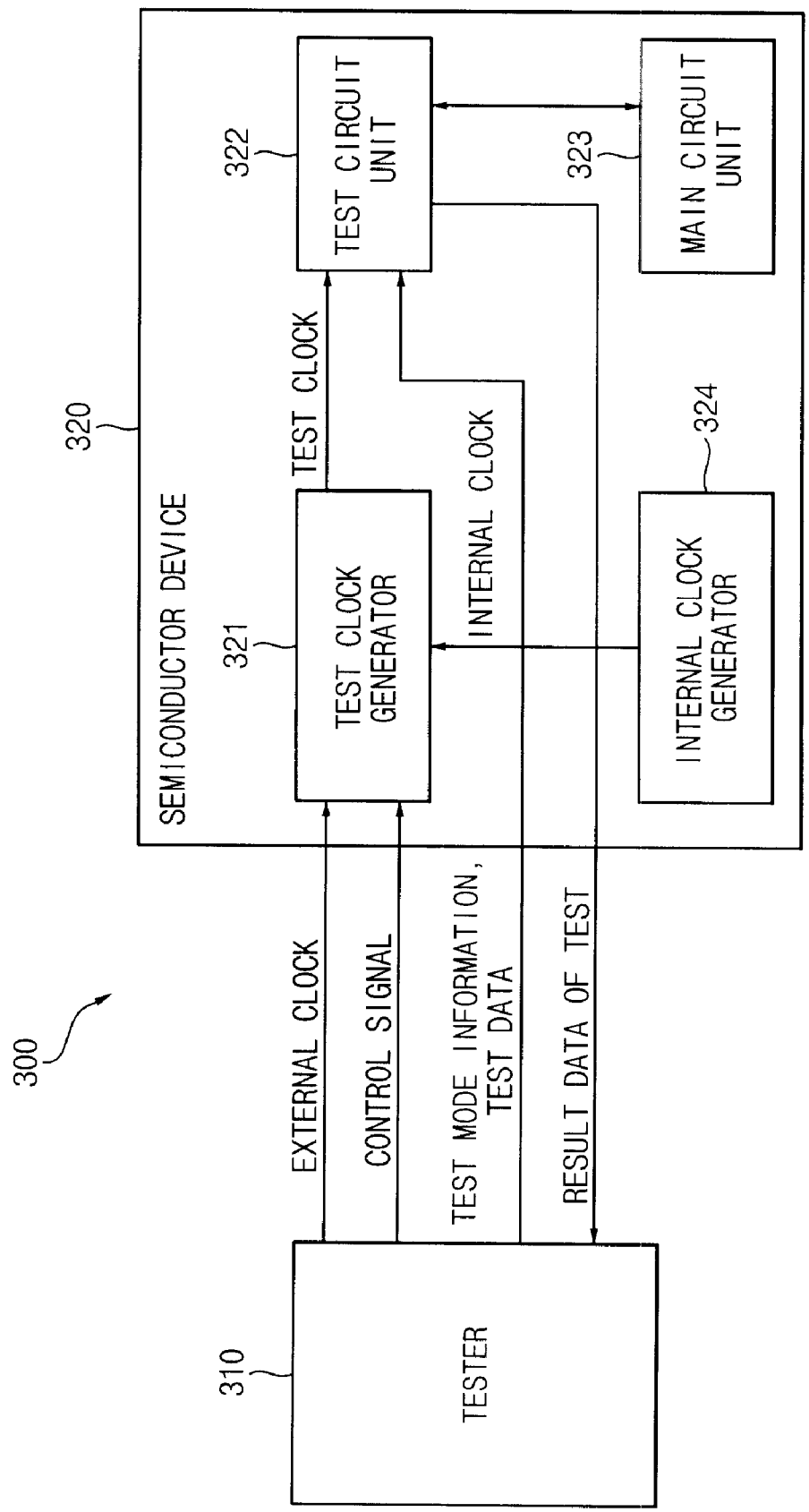
FIG. 3 is a block diagram illustrating a test system for a semiconductor device, according to an exemplary embodiment of the present invention.

FIG. 3 is a block diagram illustrating a test system for a semiconductor device, according to an exemplary embodiment of the present invention. A test system 300 includes a semiconductor device 320 and a tester 310, which provides the semiconductor device 320 with a test signal.

The tester 310 provides an external clock signal ("clock signal" is indicated as "CLOCK" throughout the drawings), a control signal, test mode information, and test data for testing the semiconductor device 320. The semiconductor device 320 undergoes the test process, and transmits test result data to the tester 310. The tester 310 determines whether or not the semiconductor device 320 operates normally, based on the test result data.

The semiconductor device 320 includes a main circuit unit 323, a test circuit unit 322 for testing the main circuit unit 323, an internal clock signal generator 324, and a test clock signal generator 321.

The main circuit unit 323 is required for testing whether inherent functions of the semiconductor device 320 operate when the semiconductor device 320 is employed. For example, the main circuit unit 323 may be a main processor, a signal conversion circuit, a digital signal processor, an image processor, etc.

The test circuit unit 322, which is used for testing the main circuit unit 323, may include a scan circuit, a BIST circuit, and a test mode register that converts setting of the semiconductor device 320 according to the test mode information.

The test clock signal generator 321 generates a test clock signal, based on the external clock signal, an internal clock signal, and a control signal. The test clock signal generator 321 generates the test clock signal during the shift period and the capture period according to the control signal. For example, the test clock signal generator 321 may output the external clock signal as the test clock signal during the shift period, and output a gated clock signal generated by gating the internal clock signal as the test clock signal during the capture period. The generated test clock signal may be transmitted to the test circuit unit 322 or may be directly transmitted to the main circuit unit 323.

The internal clock signal generator 324 generates an internal clock signal for operating the main circuit unit 323. The internal clock signal generator 324 may be a phase locked loop (PLL) in the semiconductor device 320. The internal clock signal may have a higher frequency than that of the external clock signal provided from the tester 310. In a test mode, the internal clock signal is provided to the test clock signal generator 321 for generating the test clock signal.

Figure 4:
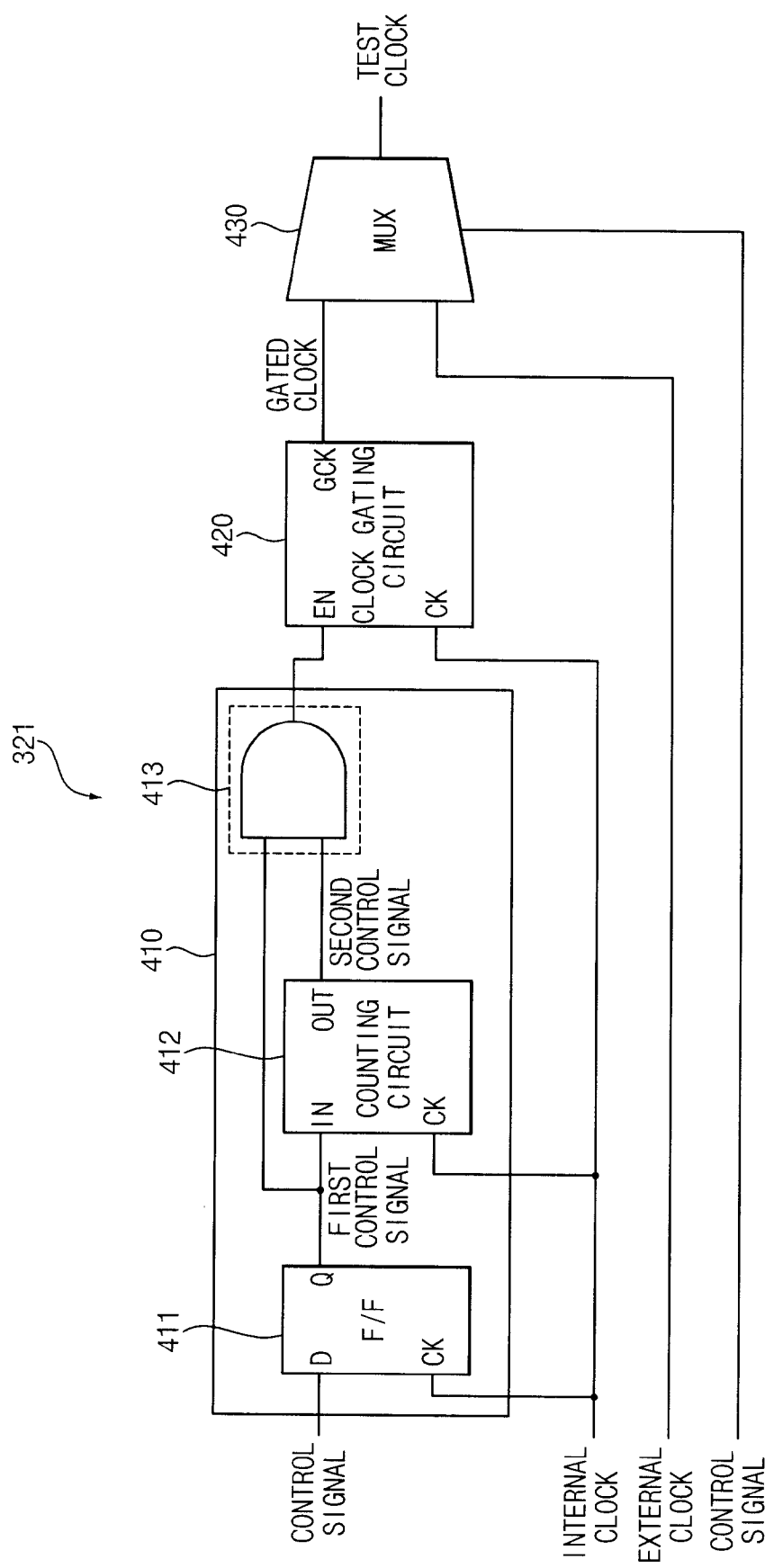
FIG. 4 is a block diagram illustrating a test clock signal generator, according to an exemplary embodiment of the present invention.

FIG. 4 is a block diagram illustrating a test clock signal generator, according to an exemplary embodiment of the present invention. The depicted test clock signal generator 321 generates the gated clock signal by gating the internal clock signal, based on the control signal, and selectively outputs the gated clock signal and the external clock signal.

In FIG. 4, the test clock signal generator 321 includes a gate control signal generator 410 which generates a gate control signal, based on the control signal, and a clock gating circuit 420 which gates the internal clock signal according to the gate control signal.

The gate control signal generator 410 generates the gate control signal from the control signal, synchronized with the internal clock signal. Thus, the gate control signal generator 410 includes a flip-flop 411 for generating a first control signal by synchronizing the control signal with the internal clock, a counting circuit 412 for generating a second control signal by counting the internal clock signal when the first control signal activating the counting circuit 412 is applied thereto, and a logic circuit 413 for generating the gate control signal by logic-operating the first control signal and the second control signal.

The counting circuit 412 counts the internal clock signal, so that when the number of the internal clock signal reaches a predetermined number, the second control signal is inactivated. The detailed process of generating the gated clock signal is described with reference to FIG. 5.

Figure 5:
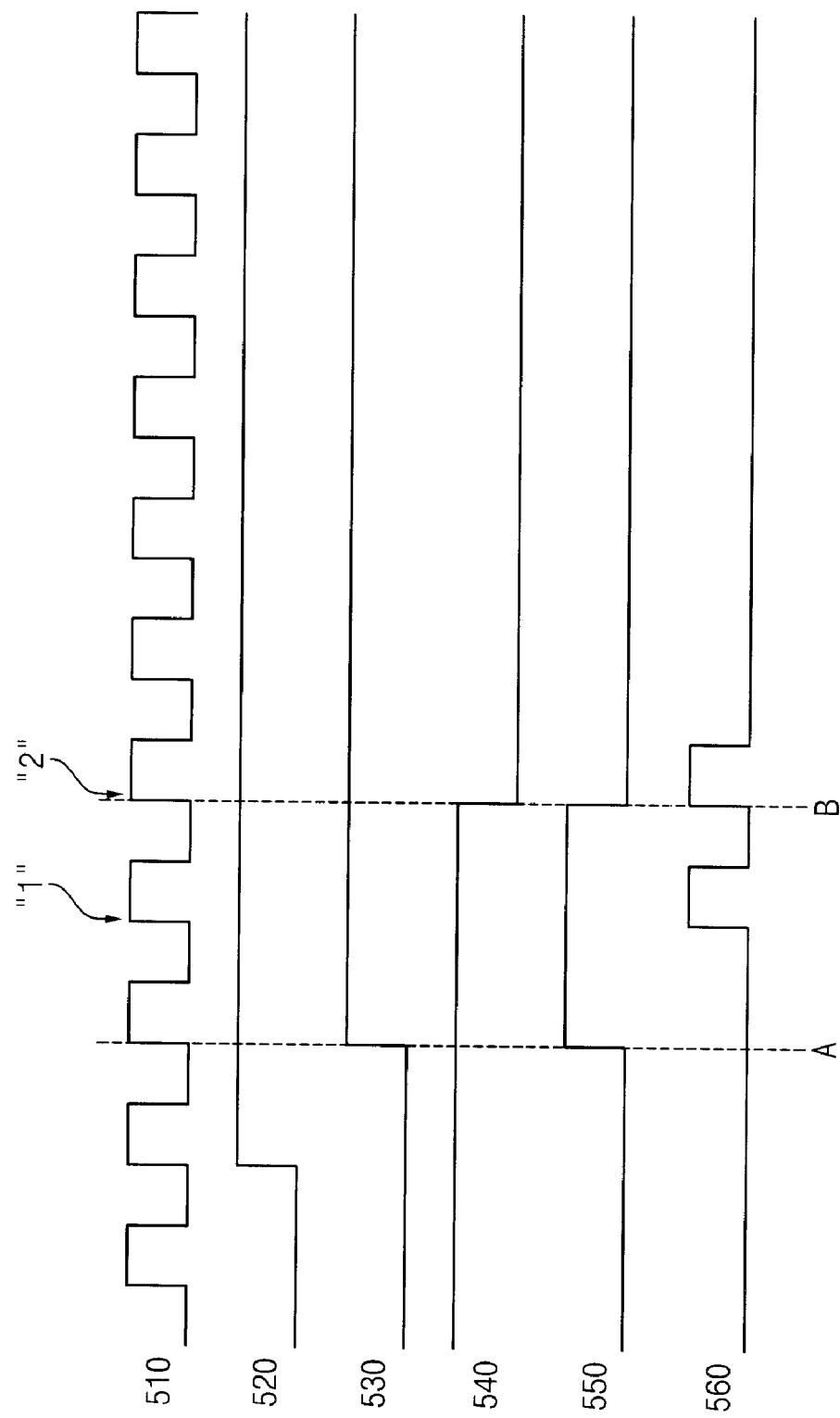
FIG. 5 is a timing diagram illustrating an exemplary process of generating a test clock signal by the test clock signal generator in FIG. 4.

FIG. 5 is a timing diagram illustrating an example of a process of generating the test clock signal by the test clock signal generator 321 in FIGS. 3 and 4. FIG. 5 illustrates the internal clock signal 510, the control signal 520, the first control signal 530, the second control signal 540, the gate control signal 550, and the gated clock signal 560. The internal clock signal 510 has a higher frequency than that of the external clock signal, and may be used to operate the main circuit unit 323 in FIG. 3.

The control signal 520 is in an inactive state (low) during the shift period and is in an active state (high) during the capture period. When the control signal 520 is high, the flip-flop 411 of FIG. 4 outputs the first control signal 530, synchronized with the internal clock signal 510.

When the first control signal 530 becomes high, the counting circuit 412 counts the number of rising edges of the internal clock 510 to compare with a predetermined number. For example, when the predetermined number is two, the counting circuit 412 counts the number of rising edges of the internal clock signal 510 until the counted number reaches two, at which point the counting circuit 412 inactivates the second control signal 540. Therefore, the second control signal 540, which is initially in an active state (high), changes to an inactive state (low) when the counting circuit 412 counts to the predetermined number (two).

The logic circuit 413 generates the gate control signal 550 by performing an AND-operation of the first control signal 530 and the second control signal 540. The clock gating circuit 420 transmits the rising edges of the internal clock signal 510 received during an activated state (high) A-B of the gate control signal 550. Therefore, in the depicted example, the gated clock signal 560 output from the clock gating circuit 420 has two pulses.

Figure 6:
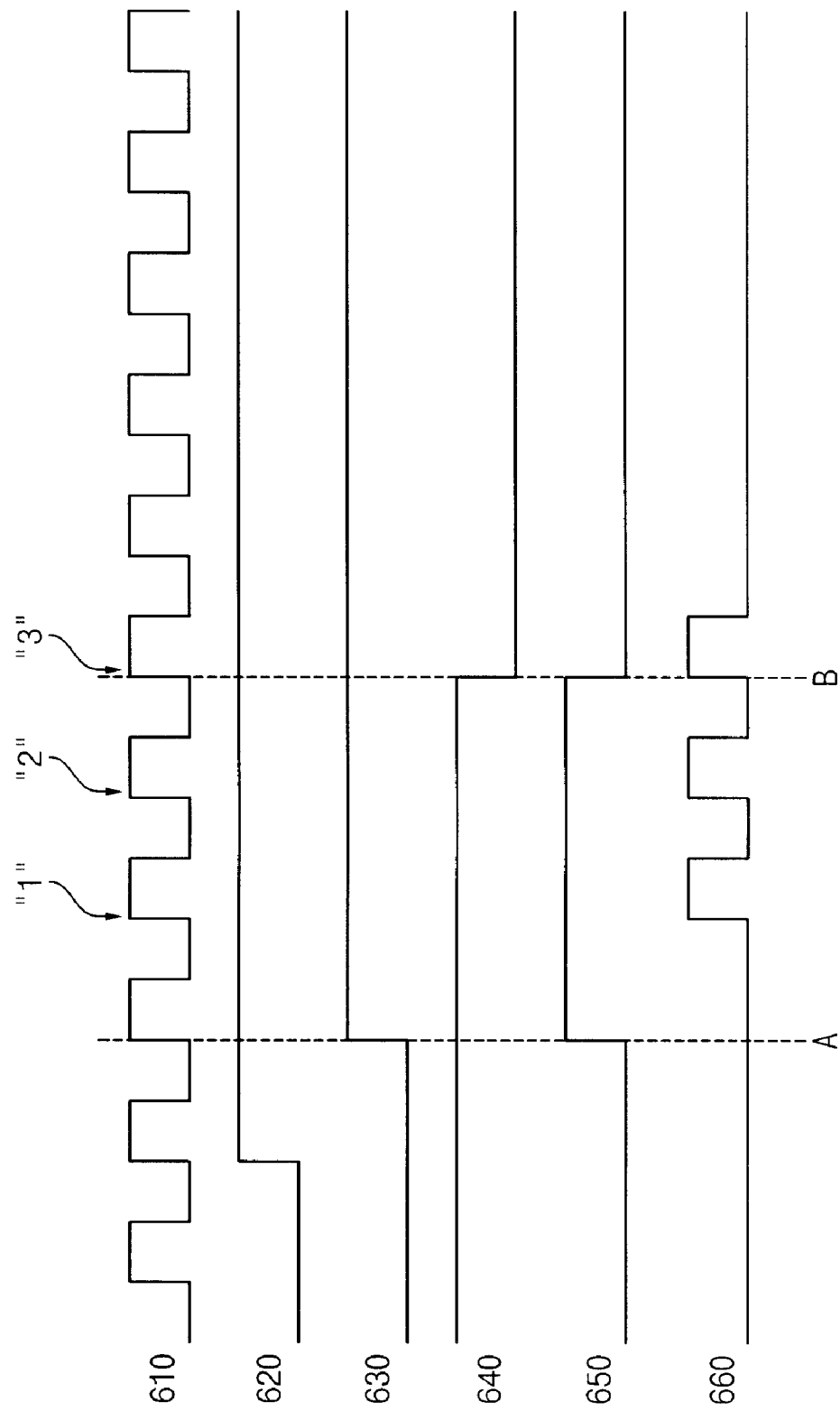
FIG. 6 is a timing diagram illustrating another exemplary process of generating a test clock signal by the test clock signal generator in FIG. 4.

FIG. 6 is a timing diagram illustrating another example of a process of generating the test clock signal by the test clock signal generator 321 in FIGS. 3 and 4. FIG. 6 illustrates the internal clock signal 610, the control signal 620, the first control signal 630, the second control signal 640, the gate control signal 650, and the gated clock signal 660. The internal clock signal 610 has a higher frequency than that of the external clock signal, and may be use to operate the main circuit unit 323.

The control signal 620 is in an inactive state (low) during the shift period and is in an active state (high) during the capture period. When the control signal 620 is high, the flip-flop 411 of FIG. 4 outputs the first control signal 630, synchronized with the internal clock 610.

When the first control signal 630 becomes high, the counting circuit 412 counts the number of rising edges of the internal clock signal to compare with a predetermined number. For example, when the predetermined number is three, the counting circuit 412 counts the number of rising edges of the internal clock signal 610 until the counted number reaches three, at which point the counting circuit 412 inactivates the second control signal 640. Therefore, the second control signal 640, which is initially in an activated state (high), changes to an inactivated state (low) when the counting circuit 412 counts to the predetermined number (three).

The logic circuit 413 generates the gate control signal 650 by performing an AND-operation of the first control signal 630 and the second control signal 640. The clock gating circuit 420 transmits the rising edges of the internal clock signal 610 received during an active state (high) A-B of the gate control signal 650. Therefore, in the depicted example, the gated clock signal 660 output from the clock gating circuit 420 has three pulses.

The test clock signal generator 321 may thus control the number of the pulses of the gated clock signal 560, 660 by setting the predetermined number of the counting circuit 412.

The clock signal multiplexer 430 selectively outputs one of the external clock signal and the gated clock signal. The clock signal multiplexer 430 outputs the external clock signal when the control signal is low. The clock signal multiplexer 430 outputs the gated clock signal when the control signal is high. That is, the test clock signal output from the clock signal multiplexer 430 is the external clock signal when the control signal is low and is the gated clock signal when the control signal is high.

Figure 7:
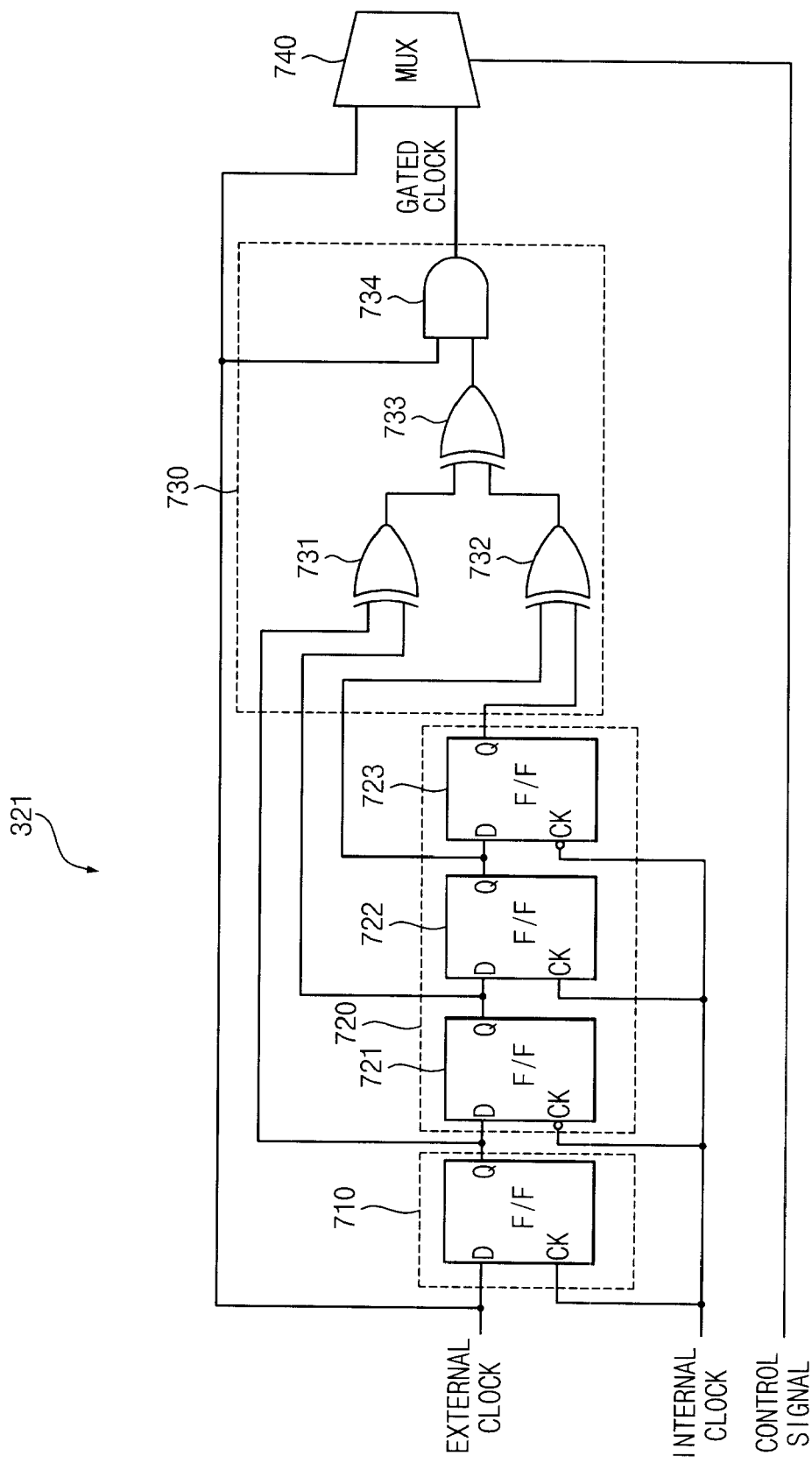
FIG. 7 is a block diagram illustrating a test clock signal generator, according to another exemplary embodiment of the present invention.

FIG. 7 is a block diagram illustrating a test clock signal generator, according to another exemplary embodiment of the present invention.

The test clock signal generator 321 generates delayed clock signals, based on an external clock signal, and generates a gated clock signal, based on the delayed clock signals. The test clock signal generator 321 includes a reference clock signal generating circuit 710, a delayed clock signal generating circuit 720 and a gated clock signal generating circuit 730.

The test clock signal generator 321 further includes a clock signal multiplexer 740 that selectively outputs one of the external clock signal and the gated clock signal according to the control signal. The clock signal multiplexer 740 outputs the gated clock signal to a test clock when the control signal is in an activated state (high). The clock signal multiplexer 740 outputs the external clock signal to the test clock when the control signal is in an inactivated state (low).

The reference clock signal generating circuit 710 synchronizes the external clock signal provided from the tester with the internal clock signal having a high frequency. For example, the reference clock signal generating circuit 710 may include a flip-flop synchronized with the internal clock signal.

The delayed clock signal generating circuit 720 generates delayed clock signals using flip-flops 721 through 723. The first flip-flop 721 generates a first delayed clock signal by delaying a reference clock signal by a half period of an internal clock signal. The second flip-flop 722 generates a second delayed clock signal by delaying the reference clock signal by one period of the internal clock signal. The third flip-flop 723 generates a third delayed clock signal by delaying the reference clock signal by one and a half periods of the internal clock signal.

The gated clock signal generating circuit 730 generates a gated clock signal, based on the reference clock signal, the first delayed clock signal, the second delayed clock signal, and the third delayed clock signal.

A first XOR gate 731, a second XOR gate 732, and a third XOR gate 733 generate a signal having two pulses at the same frequency as that of the internal clock signal at a time when the reference clock signal transitions, either from a high level to a low level, or from low level to a high level. An AND gate 734 generates a gated clock signal from the external clock signal and the output signal of the third XOR gate 733.

Figure 8:
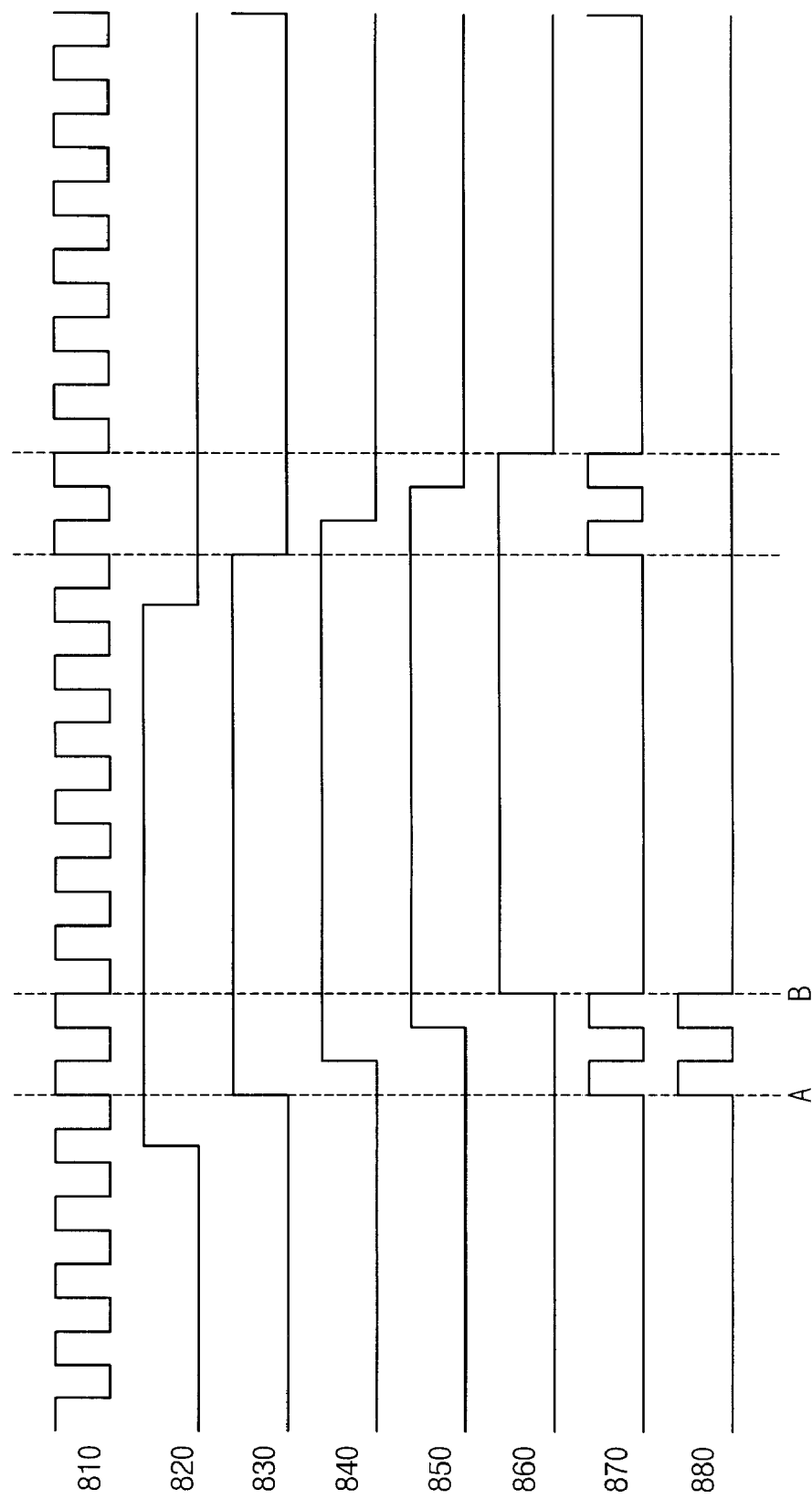
FIG. 8 is a timing diagram illustrating an exemplary process of generating a test clock signal by the test clock signal generator in FIG. 7.

The detailed process of generating the gated clock will be described with reference to FIG. 8, which is a timing diagram illustrating an example of a process of generating the test clock signal by the test clock signal generator in FIG. 7. FIG. 8 illustrates the internal clock signal 810, the external clock signal 820, the reference clock signal 830, the first delayed clock signal 840, the second delayed clock signal 850, the third delayed clock signal 860, the output signal 870 of the third XOR gate 733, and the gated clock signal 880. The internal clock signal 810 has a higher frequency than that of the external clock signal 820 and may be used to operate the main circuit unit.

The reference clock signal generating circuit 710 generates the reference clock signal 830 by synchronizing the external clock signal 820 with the internal clock signal 810. The first delayed clock signal 840, the second delayed clock signal 850 and the third delayed clock signal 860 are respectively delayed by a half period, one period, and one and a half periods of the internal clock signal 810 with respect to the reference clock signal 830. Therefore, operations of the first flip-flop 721 and the third flip-flop 723 are synchronized with a falling edge of the internal clock signal 810, and operation of the second flip-flop 722 is synchronized with a rising edge of the internal clock signal 810.

The AND gate 734 performs an AND-operation of the output signal 870 of the third XOR gate 733 and the external clock signal 820, and outputs the gated clock signal 880.

For example, the gated clock signal generating circuit 730 includes three XOR gates, each having two inputs. Alternatively, an XOR gate having four inputs may be used instead of the three XOR gates having two inputs.

The test clock signal generator that generates the test clock signal by using the flip-flops and the logic circuit may be transformed.

Figure 9:
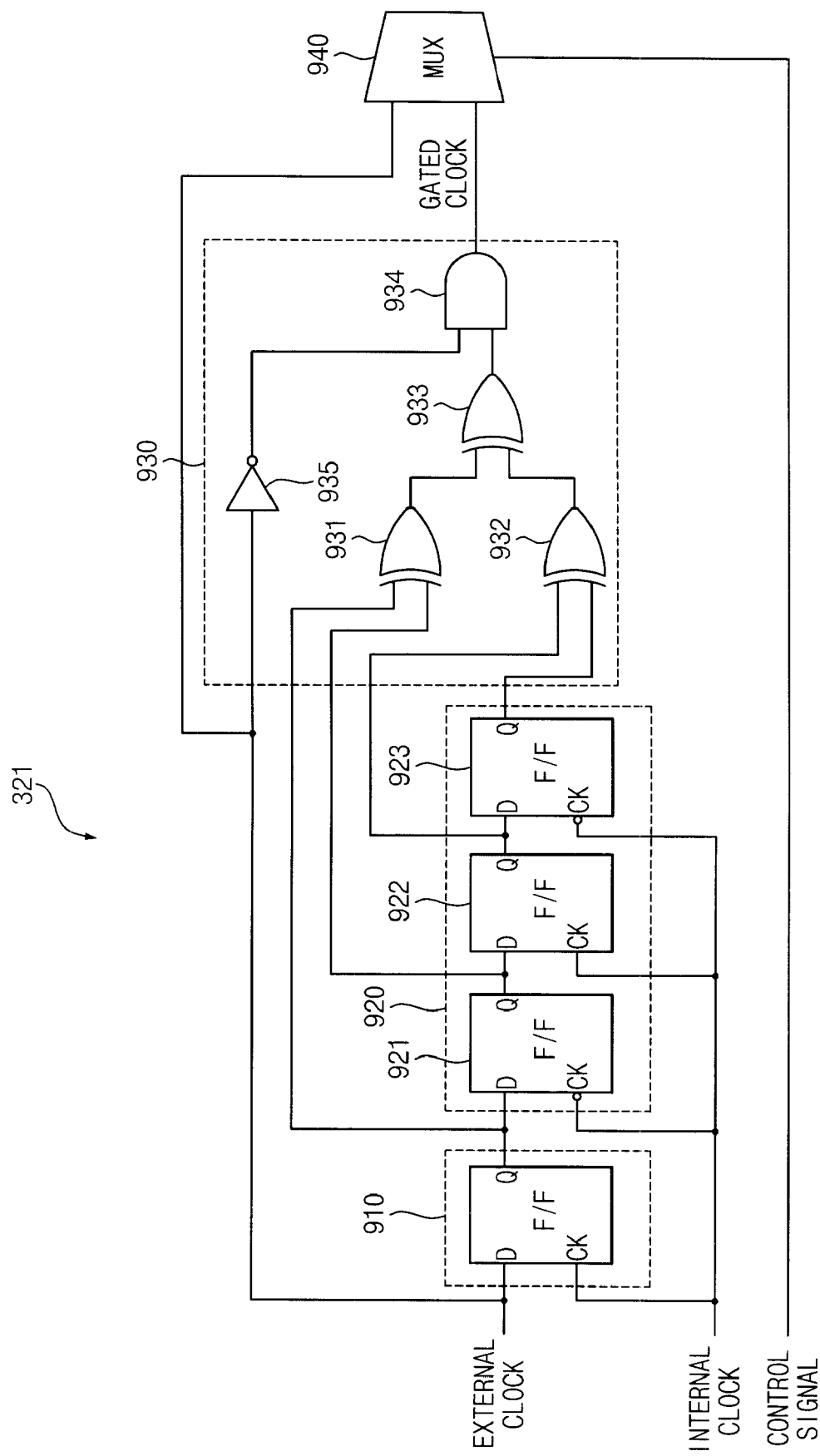
FIG. 9 is a block diagram illustrating a test clock signal generator, according to another exemplary embodiment of the present invention.

FIG. 9 is a block diagram illustrating a test clock signal generator according to another exemplary embodiment of the present invention. Referring to FIGS. 3 and 9, the test clock signal generator 321 generates delayed clock signals based on an external clock signal, and generates a gated clock signal, based on the delayed clock signals. The test clock signal generator 321 includes a reference clock signal generating circuit 910, a delayed clock signal generating circuit 920, and a gated clock signal generating circuit 930.

The test clock signal generator 321 further includes a clock signal multiplexer 940 that selectively outputs one of the external clock signal and the gated clock signal, according to the control signal. The clock signal multiplexer 940 outputs the gated clock signal as a test clock signal when the control signal is activated (high). The clock signal multiplexer 940 outputs the external clock signal as the test clock signal, when the control signal is inactivated (low).

The reference clock signal generating circuit 910, the delayed clock signal generating circuit 920, a first flip-flop 921, a second flip-flop 922, and a third flip-flop 923 have the same components and functionality with the reference clock signal generating circuit 710, the delayed clock signal generating circuit 720, the first flip-flop 721, the second flip-flop 722, and the third flip-flop 723 described with respect to FIG. 7. Therefore, the description concerning the above elements will not be repeated.

In FIG. 9, the gated clock signal generating circuit 930 further includes an inverter 935 as compared to the gated clock signal generating circuit 730 in FIG. 7. Accordingly, output signals of a first XOR gate 931, a second XOR gate 932, and a third XOR gate 933 are respectively the same as the output signals of the first XOR gate 731, the second XOR gate 732, and the third XOR gate 733 in FIG. 7, although an output signal (i.e., the gated clock signal) of AND gate 934 is different from the output signal of AND gate 734.

Figure 10:
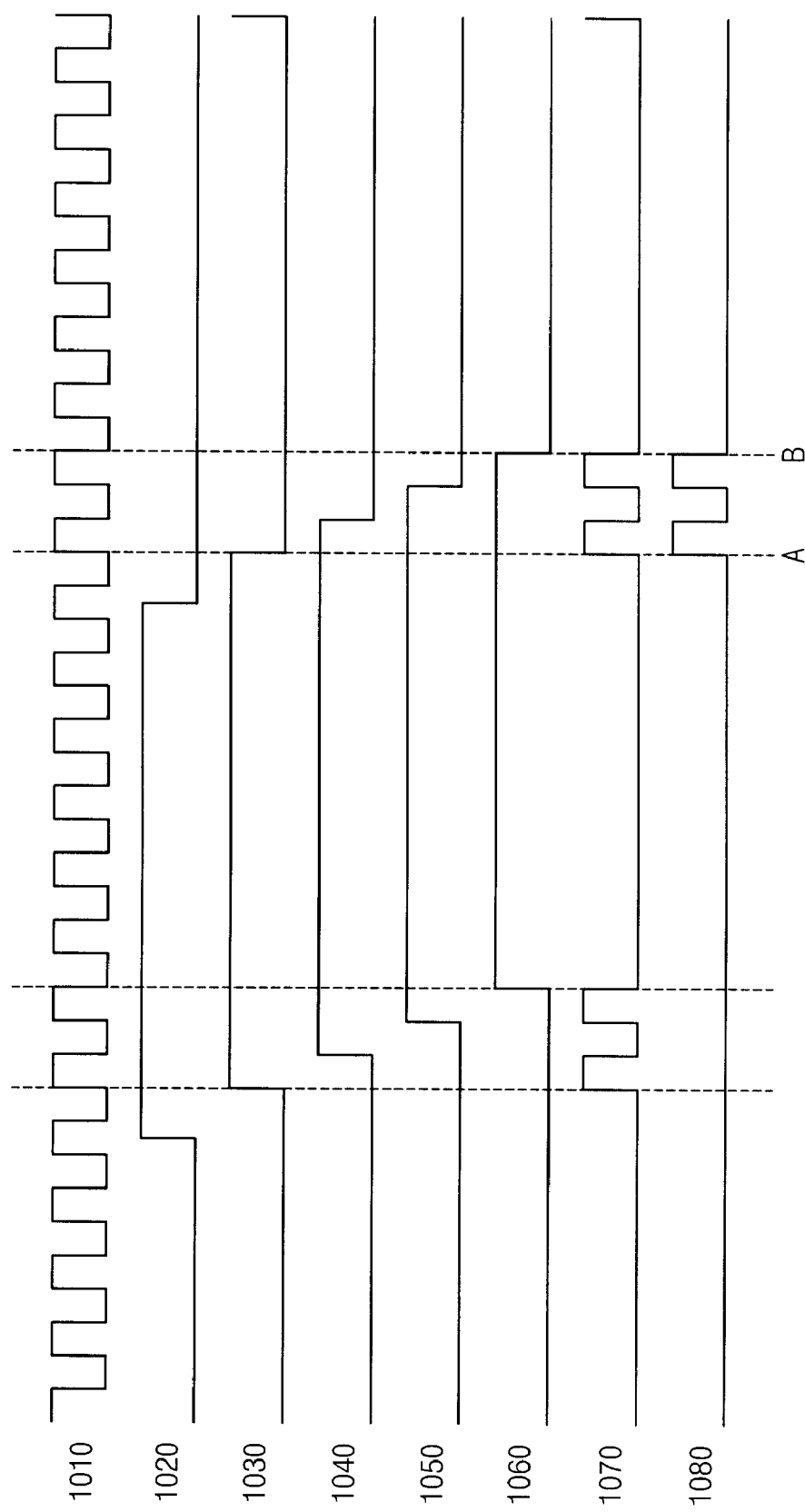
FIG. 10 is a timing diagram illustrating an exemplary process of generating a test clock signal by the test clock signal generator in FIG. 9.

The detailed process will be described with reference to FIG. 10, which is a timing diagram illustrating an example of a process of generating the test clock signal by the test clock signal generator in FIG. 9. FIG. 10 illustrates the internal clock signal 1010, the external clock signal 1020, the reference clock signal 1030, the first delayed clock signal 1040, the second delayed clock signal 1050, the third delayed clock signal 1060, the output signal 1070 of the third XOR gate 933, and the gated clock signal 1080.

In comparison with the signals of FIG. 8, the internal clock signal 1010, the external clock 1020, the reference clock signal 1030, the first delayed clock signal 1040, the second delayed clock signal 1050, the third delayed clock signal 1060, and the output signal 1070 of the third XOR gate 933 are respectively the same as the internal clock signal 810, the external clock signal 820, the reference clock signal 830, the first delayed clock signal 840, the second delayed clock signal 850, the third delayed clock signal 860, and the output signal 870 of the third XOR gate 733. However, unlike the gated clock signal 880 in FIG. 8, the gated clock signal 1080 has two pulses at a falling edge of the reference clock signal 1030.

Figure 11:
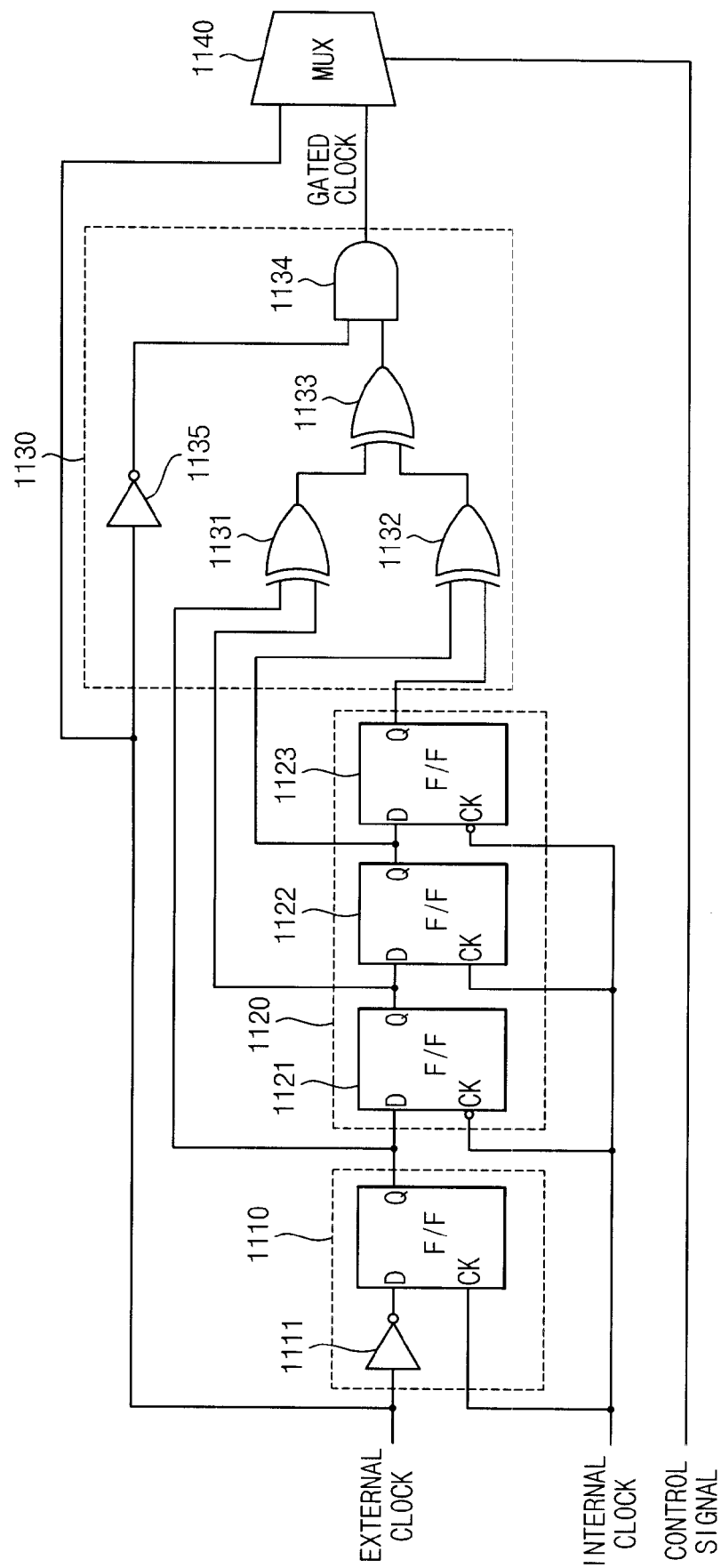
FIG. 11 is a block diagram illustrating a test clock signal generator, according to another exemplary embodiment of the present invention.

FIG. 11 is a block diagram illustrating a test clock signal generator, according to another exemplary embodiment of the present invention. The test clock signal generator 321 has substantially the same components and functionality as those described with respect to the test clock signal generator in FIG. 9. In particular, the test clock signal generator 321 depicted in FIG. 11 includes a reference clock signal generating circuit 1110, a delayed clock signal generating circuit 1120, a gated clock signal generating circuit 1130 and a clock signal multiplexer 1140, which respectively correspond to the reference clock signal generating circuit 910, the delayed clock signal generating circuit 920, the gated clock signal generating circuit 930 and the clock signal multiplexer 940 of FIG. 9. Therefore, the description of these elements, as well as their associated components and functionality, will not be repeated with respect to FIG. 11.

However, in comparison with the test clock signal generator 321 of FIG. 9, the test clock signal generator 321 of FIG. 11 further includes an inverter 1111. The inverter 1111 slightly delays the external clock signal.

Referring to FIG. 9, when the reference clock signal and internal clock signal are exactly synchronized with each other, the gated clock signal output from the AND gate 934 may be distorted. For example, when the delay time of the process, in which the external clock signal is transmitted to the AND gate 934 through the inverter 935, is longer than the delay time of the process, in which the output signal (i.e., the first delayed clock signal) of the first flip-flop 921 is transmitted to the AND gate 934 through the first XOR gate 931 and the third XOR gate 933, the gated clock may be distorted. When the reference clock signal is generated, the inverter 1111 addresses the potential problem by slightly delaying the external clock signal.

The test clock signal generators shown in FIG. 7, FIG. 9, and FIG. 11 may not arbitrarily select the number of the pulses included in the gated clock signal. For example, the number of the pulses included in the gated clock signal may be determined by the number of the flip-flops included in the delayed clock signal generating circuit of the test clock signal generator.

Figure 12:
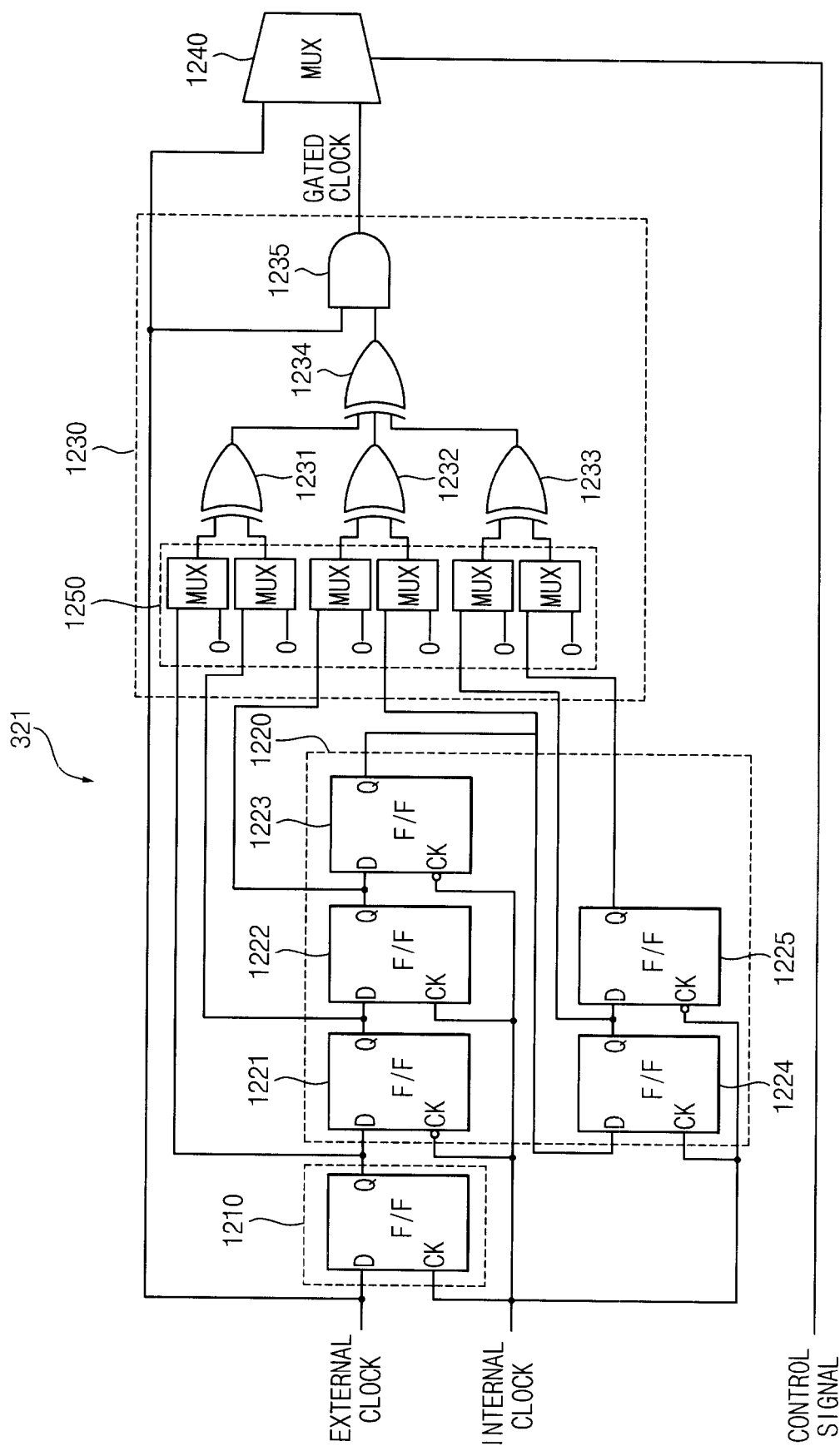
FIG. 12 is a block diagram illustrating a test clock signal generator, according to another exemplary embodiment of the present invention.

A test clock signal generator controlling the number of the pulses included in the gated clock will be described with reference to FIG. 12. FIG. 12 is a block diagram illustrating a test clock signal generator, according to another exemplary embodiment of the present invention.

The test clock signal generator 321 generates delayed clock signals, based on an external clock signal, and generates a gated clock signal, based on the delayed clock signals. In the depicted embodiment, the test clock signal generator 321 includes a reference clock signal generating circuit 1210, a delayed clock signal generating circuit 1220 and a gated clock signal generating circuit 1230.

The test clock signal generator 321 further includes a clock signal multiplexer 1240 that selectively outputs one of the external clock signal or the gated clock signal according to the control signal. The clock signal multiplexer 1240 outputs the gated clock signal as a test clock signal, when the control signal is in an activated state (high). The clock signal multiplexer 1240 outputs the external clock signal as the test clock signal, when the control signal is in an inactivated state (low).

The reference clock signal generating circuit 1210 synchronizes the external clock signal provided from the tester 310 with the internal clock signal having a high frequency. For example, the reference clock signal generating circuit 1210 may include a flip-flop operating synchronously with the internal clock signal.

The delayed clock signal generating circuit 1220 generates delayed clock signals using flip-flops. The first flip-flop 1221 generates a first delayed clock signal by delaying a reference clock signal by a half period of the internal clock signal. The second flip-flop 1222 generates a second delayed clock signal by delaying the reference clock signal by one period of the internal clock signal. The third flip-flop 1223 generates a third delayed clock signal by delaying the reference clock signal by one and a half periods of the internal clock signal. The fourth flip-flop 1224 generates a fourth delayed clock signal by delaying the reference clock signal by two periods of the internal clock signal. The fifth flip-flop 1225 generates a fifth delayed clock signal by delaying the reference clock signal by two and a half periods of the internal clock signal.

The gated clock signal generating circuit 1230 generates a gated clock signal, based on the reference clock signal, the first delayed clock signal, the second delayed clock signal, the third delayed clock signal, the fourth delayed clock signal and the fifth delayed clock signal.

Unlike the gated clock signal generating circuit 730 in FIG. 7, the gated clock signal generating circuit 1230 further includes a selecting circuit 1250.

When a gated clock signal having two pulses is generated, for example, the selecting circuit 1250 selectively outputs one among the reference clock signal, the first delayed clock signal, the second delayed clock signal and the third delayed clock signal. In this case, a first XOR gate 1231 receives the reference clock signal and the first delayed clock signal, and a second XOR gate 1232 receives the second delayed clock signal and the third delayed clock signal. However, a third XOR gate 1233 receives 0. A fourth XOR gate 1234 outputs a signal having two pulses at a transition time of the reference clock signal.

When the gated clock signal having three pulses is generated, for example, the selecting circuit 1250 selectively outputs one among the reference clock signal, the first delayed clock signal, the second delayed clock signal, the third delayed clock signal, the fourth delayed clock signal and the fifth delayed clock signal. In this case, the first XOR gate 1231 receives the reference clock signal and the first delayed clock signal, the second XOR gate 1232 receives the second delayed clock signal and the third delayed clock signal, and the third XOR gate 1233 receives the fourth delayed clock signal and the fifth delayed clock signal. The fourth XOR gate 1234 outputs a signal having three pulses at the transition time of the reference clock signal.

An AND gate 1235 generates the gated clock signal by performing an AND operation of the external clock signal and the output signal of the fourth XOR gate 1234.

As indicated above, the test clock signal generator 321 may be variously changed according to different exemplary embodiments without departing from the spirit and scope of the present invention.

Figure 13:
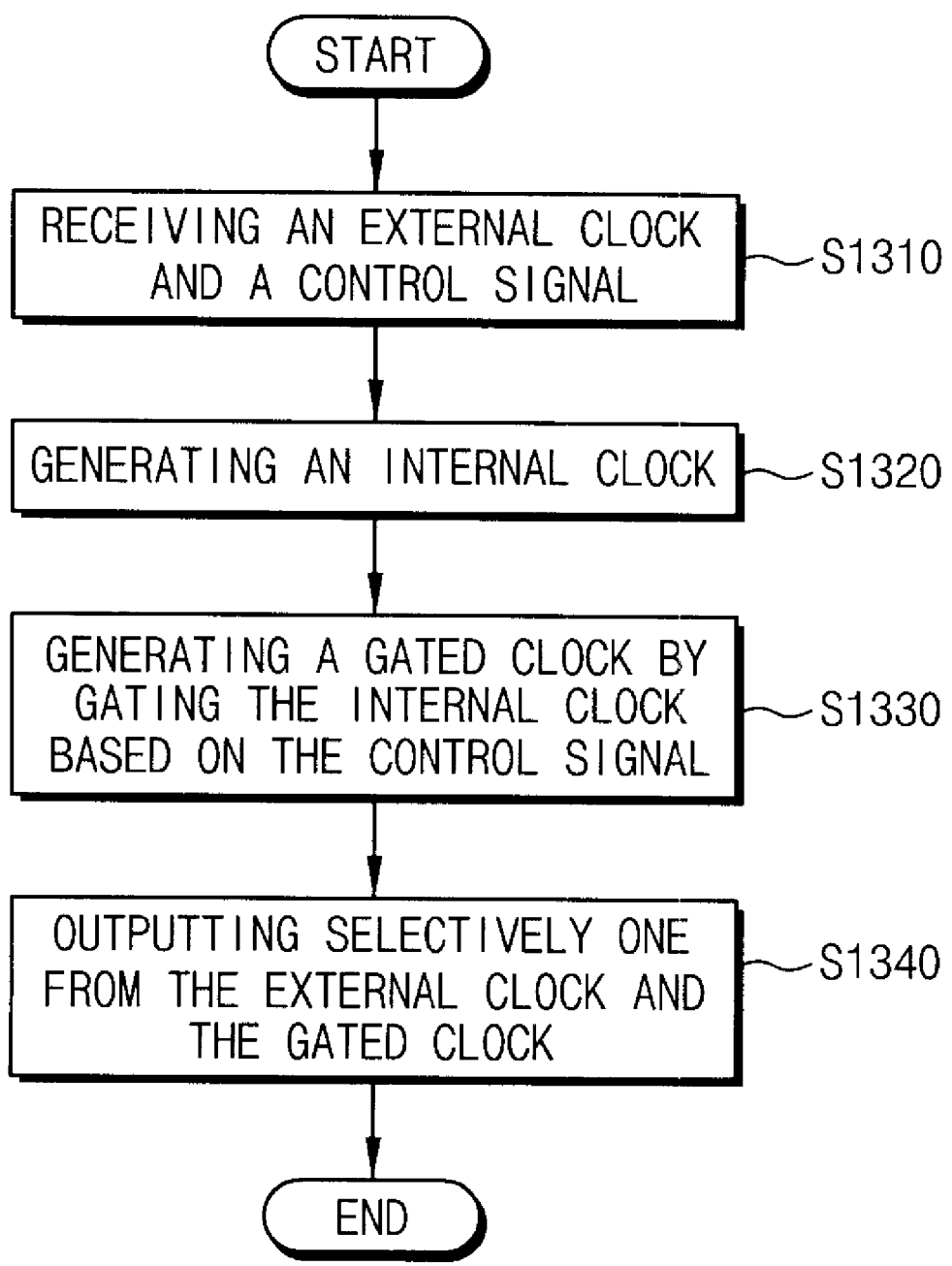
FIG. 13 is a flow chart illustrating a process of generating a test clock signal, according to an exemplary embodiment of the present invention.

FIG. 13 is a flow chart illustrating a process of generating a test clock signal, according to an exemplary embodiment of the present invention.

A test clock signal generator in a semiconductor device, which is an object of a test, receives an external clock signal and a control signal from a tester (step S1310). An internal clock signal generator in the semiconductor device generates an internal clock signal, which has a frequency higher than a frequency of the external clock signal (step S1320).

The test clock signal generator generates a gated clock signal by gating the internal clock signal, based on the control signal (step S1330). The test clock signal generator generates a gate control signal, based on the control signal, and gates the internal clock signal using the gate control signal. When the gate control signal is generated, the test clock signal generator controls the number of pulses included in the gated clock signal using a counting circuit.

The test clock signal generator selectively outputs one of the external clock signal and the gated clock signal to a main circuit unit (step S1340). When the control signal is in an activated state, the test clock signal generator provides the main circuit unit with the gated clock signal. When the control signal is in an inactivated state, the test clock signal generator provides the main circuit unit with the external clock signal.

Figure 14:
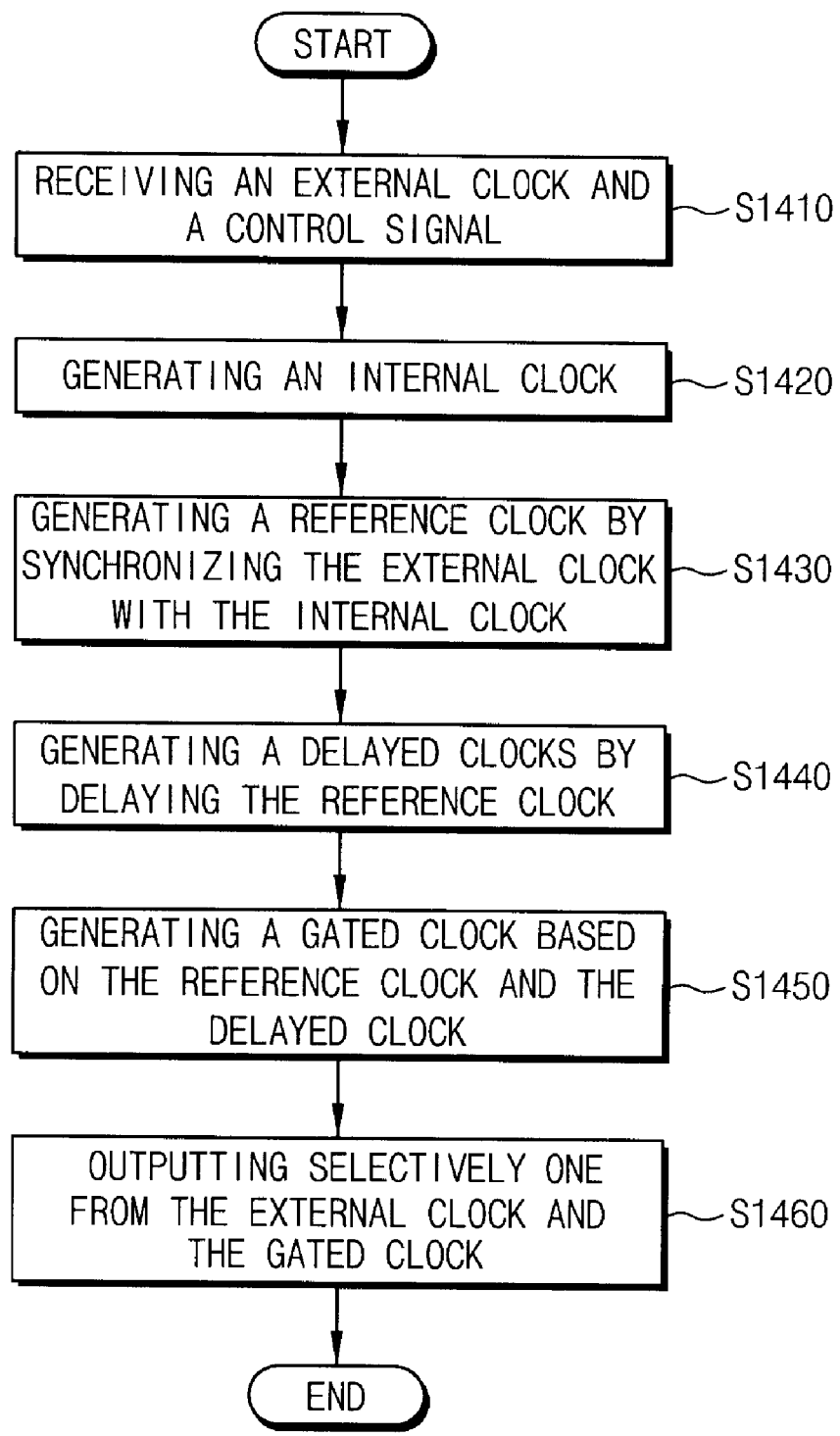
FIG. 14 is a flow chart illustrating a process of generating a test clock signal, according to another exemplary embodiment of the present invention.

FIG. 14 is a flow chart illustrating a process of generating a test clock signal, according to another exemplary embodiment of the present invention.

A test clock signal generator in a semiconductor device, which is an object of a test, receives an external clock signal and a control signal from a tester (step S1410). An internal clock signal generator in the semiconductor device generates an internal clock signal, which has a frequency that is higher than a frequency of the external clock signal (step S1420).

The test clock signal generator generates a reference clock signal by synchronizing the external clock signal with the internal clock signal (step S1430). When the reference clock is generated, the test clock signal generator generates delayed clock signals by delaying the reference clock signal (step S1440). The test clock signal generator generates a gated clock signal using the reference clock signal and the delayed clock signals (step S1450).

The test clock signal generator selectively outputs one of the external clock signal and the gated clock signal to the main circuit unit (step S1460). When the control signal is in an activated state, the test clock signal generator provides the main circuit unit with the gated clock signal. When the control signal is in an inactivated state, the test clock signal generator provides the main circuit unit with the external clock signal.

As described above, the test clock signal generator according to exemplary embodiments of the present invention may generate the test clock signal for scan testing, and may be incorporated internally to the semiconductor device that is the object of the test.

When the test clock signal from the test clock signal generator is used, the production cost of the semiconductor device may be lowered because the semiconductor device may be tested by an inexpensive test device. Also, the test clock signal generator according to exemplary embodiments of the present invention may be integrated in a narrow area, due to a simple hardware component.

Although the present invention has been described with reference to exemplary embodiments, it will be apparent to those skilled in the art that various modifications and changes may be made without departing from the spirit and scope of the present invention. Therefore, it should be understood that the above embodiments are not limiting, but illustrative in all aspects.

What is claimed is:

1. A method of generating a test clock signal for scan testing of a main circuit in a semiconductor device, the method comprising:
   receiving an external clock signal and a control signal;
   generating a gate control signal, based on the control signal, synchronized with an internal clock signal;
   generating a gated clock signal by gating the internal clock signal based on the control signal, the internal clock signal having a frequency higher than a frequency of the external clock signal; and
   selectively outputting one of the external clock signal and the gated clock signal, the external clock signal being output during a shift period and the gated clock signal being output during a capture period,
   wherein generating the gate control signal comprises:
      generating a first control signal by synchronizing the control signal with the internal clock signal;
      generating a second control signal, which is initially active and which becomes inactive after a number of pulses of the internal clock signal equals a predetermined number after the first control signal becomes active; and
      generating the gate control signal, which is active when both the first control signal and the second control signal are active.

2. The method of claim 1, wherein gating the internal clock signal comprises:
   outputting the internal clock signal when the gate control signal is active; and
   blocking the internal clock signal when the gate control signal is inactive.

3. The method of claim 1, wherein the internal clock signal comprises an output clock signal of a phase lock loop in the semiconductor device.

4. The method of claim 1, wherein selectively outputting the one of the external clock signal and the gated clock signal comprises:
   outputting the gated clock signal when the control signal is active; and
   outputting the external clock signal when the control signal is inactive.

5. A method of generating a test clock signal for scan testing of a main circuit in a semiconductor device, the method comprising:
   receiving an external clock signal and a control signal generated externally from the semiconductor device;
   generating a reference clock signal synchronized with an internal clock signal based on the external clock signal;
   generating a plurality of delayed clock signals by delaying the reference clock signal using flip-flops operating synchronously with the internal clock signal, an n-th delayed clock signal corresponding to the reference clock signal delayed by n/2 periods of the internal clock signal, where n is a natural number;
   generating a gated clock signal, based on the reference clock signal and the plurality of delayed clock signals; and
   selectively outputting one of the external clock signal and the gated clock signal according to the control signal, the external clock signal being output during a shift period and the gated clock signal being output during a capture period.

6. The method of claim 5, wherein generating the plurality of delayed clock signals comprises:
   generating a first delayed clock signal corresponding to the reference clock signal delayed by a half period of the internal clock signal;
   generating a second delayed clock signal corresponding to the reference clock signal delayed by one period of the internal clock signal; and
   generating a third delayed clock signal corresponding to the reference clock signal delayed by one and a half periods of the internal clock signal.

7. The method of claim 5, wherein generating the gated clock signal comprises performing an XOR operation of the reference clock signal and the plurality of delayed clock signals.

8. The method of claim 7, wherein generating the gated clock signal further comprises performing an AND operation of a result of the XOR operation and the external clock signal.

9. The method of claim 7, wherein generating the gated clock signal further comprises:
   inverting the external clock signal; and
   performing an AND operation of a result of the XOR operation and the inverted external clock signal.

10. The method of claim 5, wherein generating the gated clock signal comprises:
    selecting at least four clock signals from among the reference clock signal and the plurality of delayed clock signals; and
    performing an XOR operation of the selected clock signals.

11. The method of claim 5, wherein generating the reference clock signal comprises:
    inverting the external clock signal; and
    synchronizing the inverted external clock signal with the internal clock signal.

12. The method of claim 5, wherein selectively outputting the one of the external clock signal and the gated clock signal comprises:
    outputting the gated clock signal when the control signal is active; and
    outputting the external clock signal when the control signal is inactive.

13. A test clock signal generator for scan testing of a main circuit in a semiconductor device, the test clock signal generator comprising:

a gate control signal generator configured to generate a gate control signal, based on an external control signal provided to the semiconductor device, synchronized with an internal clock signal;

a clock gating circuit configured to generate a gated clock signal by gating the internal clock signal based on the gate control signal, the internal clock signal having a frequency higher than a frequency of an external clock signal provided to the semiconductor device; and a clock signal multiplexer configured to selectively output one of the external clock signal and the gated clock signal, the external clock signal being output during a shift period and the gated clock signal being output during a capture period, and wherein the gate control signal generator comprises:

a flip-flop configured to generate a first control signal by synchronizing the external control signal with the internal clock signal;

a counting circuit configured to generate a second control signal, which is inactivated based on counting pulses of the internal clock signal when the first control signal is active; and a logic circuit configured to generate the gate control signal, which is activated when both the first control signal and the second control signal are active.

14. The test clock signal generator of claim 13, wherein the clock gating circuit outputs the internal clock signal when the gate control signal is active, and blocks the internal clock signal when the gate control signal is inactive.

15. The test clock signal generator of claim 13, wherein the internal clock signal is generated by a phase lock loop in the semiconductor device.

16. The test clock signal generator of claim 13, wherein the clock signal multiplexer outputs the gated clock signal when the control signal is active, and outputs the external clock signal when the control signal is inactive.

17. A test clock signal generator for scan testing of a main circuit in a semiconductor device, the test clock signal generator comprising:

a reference clock signal generating circuit configured to generate a reference clock signal synchronized with an internal clock signal based on an external clock signal and a control signal provided to the semiconductor device, the internal clock signal having a higher frequency than the external clock signal;

a delayed clock signal generating circuit configured to generate a plurality of delayed clock signals synchronized with the internal clock signal by delaying the reference clock signal, the delayed clock signal generating circuit comprising a plurality of flip-flops, an n-th delayed clock signal corresponding to the reference clock signal delayed by n/2 periods of the internal clock signal, where n is a natural number;

a gated clock signal generating circuit configured to generate a gated clock signal, based on the reference clock signal and the plurality of delayed clock signals; and a clock signal multiplexer configured to selectively output one of the external clock signal and the gated clock signal according to the control signal, the external clock signal being output during a shift period and the gated clock signal being output during a capture period.

18. The test clock signal generator of claim 17, wherein the plurality of flip-flops comprise:

a first flip-flop configured to generate a first delayed clock signal corresponding to the reference clock signal delayed by a half period of an internal clock signal;

a second flip-flop configured to generate a second delayed clock signal corresponding to the reference clock signal delayed by one period of the internal clock signal; and a third flip-flop configured to generate a third delayed clock signal corresponding to the reference clock signal delayed by one and a half periods of the internal clock signal.

19. The test clock signal generator of claim 17, wherein the gated clock signal generating circuit comprises an XOR circuit for performing an XOR operation on the reference clock signal and the plurality of delayed clock signals.

20. The test clock signal generator of claim 19, wherein the gated clock signal generating circuit further comprises an AND circuit for performing an AND operation on a result of the XOR operation and the external clock signal.

21. The test clock signal generator of claim 19, wherein the gated clock signal generating circuit further comprises:

an inverter configured to invert the external clock signal; and an AND circuit configured to perform an AND operation on the result of the XOR operation and the inverted external clock signal.

22. The test clock signal generator of claim 17, wherein the gated clock signal generating circuit comprises:

a selecting circuit configured to select at least four clock signals from among the reference clock signal and the plurality of delayed clock signals; and an XOR circuit configured to perform an XOR operation on the selected clock signals.

23. The test clock signal generator of claim 17, wherein the reference clock signal generating circuit comprises:

an inverter configured to invert the external clock signal; and a flip-flop configured to output the inverted external clock signal, synchronized with the internal clock signal.

24. The test clock signal generator of claim 17, wherein the clock signal multiplexer outputs the gated clock signal while the control signal is activated, and outputs the external clock signal while the control signal is inactivated.

* * * * *